United States Patent
Domyo et al.

(10) Patent No.: US 9,390,942 B2
(45) Date of Patent: Jul. 12, 2016

(54) METHOD, SYSTEM, AND APPARATUS FOR PREPARING SUBSTRATES AND BONDING SEMICONDUCTOR LAYERS TO SUBSTRATES

(71) Applicant: PEREGRINE SEMICONDUCTOR CORPORATION, San Diego, CA (US)

(72) Inventors: Hiroshi Domyo, San Diego, CA (US); Michael McCafferty, San Diego, CA (US); Alain Duvallet, San Diego, CA (US); Masaki Sato, San Diego, CA (US); Christopher O'Brien, San Diego, CA (US); Anthony Mark Miscione, Ramona, CA (US); George Imthurn, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 183 days.

(21) Appl. No.: 13/831,067

(22) Filed: Mar. 14, 2013

(65) Prior Publication Data
US 2014/0151704 A1 Jun. 5, 2014

Related U.S. Application Data

(60) Provisional application No. 61/732,290, filed on Nov. 30, 2012.

(51) Int. Cl.
*H01L 21/332* (2006.01)
*H01L 21/322* (2006.01)
*H01L 21/02* (2006.01)
*H01L 29/36* (2006.01)
(Continued)

(52) U.S. Cl.
CPC ...... *H01L 21/3226* (2013.01); *H01L 21/02052* (2013.01); *H01L 21/76256* (2013.01); *H01L 21/3221* (2013.01); *H01L 21/76251* (2013.01); *H01L 23/26* (2013.01); *H01L 23/3128* (2013.01); *H01L 29/36* (2013.01); *H01L 2224/16225* (2013.01); *H01L 2924/15311* (2013.01)

(58) Field of Classification Search
CPC .............. H01L 21/32226; H01L 29/36; H01L 21/76251; H01L 23/26; H01L 21/3221; H01L 2224/16225; H01L 2924/15311; H01L 23/3128
USPC ............ 438/471, 472, 476, 482, 488; 257/49, 257/E21.32, E21.569, E29.227, 16, 607
See application file for complete search history.

(56) References Cited

U.S. PATENT DOCUMENTS 5,605,602 A * 2/1997 DeBusk ......................... 438/476
5,897,362 A * 4/1999 Wallace .............. H01L 21/3226
257/E21.122

(Continued)

OTHER PUBLICATIONS

Sherman, A., "Growth and Properties of LPCVD Titanium Nitride as a Diffusion Barrier for Silicon Device Technology" J. Electrochem. Soc., vol. 137, No. 6, Jun. 1990, pp. 1892-1897.

(Continued)

*Primary Examiner* — Thinh T Nguyen
(74) *Attorney, Agent, or Firm* — Jaquez Land Greenhaus LLP; Martin J. Jaquez, Esq.

(57) ABSTRACT

Embodiments of preparing substrates for subsequent bonding with semiconductor layer are described herein. A substrate may be prepared with one or more chemicals or a sacrificial layer to limit or remove substrate contaminants and reduce substrate surface damage. Other embodiments may be described and claimed.

30 Claims, 11 Drawing Sheets

(51) Int. Cl.
*H01L 23/31* (2006.01)
*H01L 21/762* (2006.01)
*H01L 23/26* (2006.01)

(56) References Cited

U.S. PATENT DOCUMENTS

| | | | |
|---|---|---|---|
| 6,191,007 B1 * | 2/2001 | Matsui et al. | 438/459 |
| 6,670,259 B1 * | 12/2003 | Chan | H01L 21/26506 257/E21.32 |
| 2004/0097055 A1 * | 5/2004 | Henley | H01L 21/76254 438/471 |
| 2005/0245052 A1 * | 11/2005 | Inoue | 438/476 |
| 2009/0102008 A1 * | 4/2009 | Kakehata | H01L 21/2007 257/506 |
| 2009/0111242 A1 * | 4/2009 | Akiyama | H01L 21/76254 438/458 |
| 2010/0258915 A1 * | 10/2010 | Hisakane | 257/618 |
| 2012/0205831 A1 * | 8/2012 | Dohmann et al. | 264/40.6 |

OTHER PUBLICATIONS

Kern, Werner, "The Evolution of Silicon Wafer Cleaning Technology" J. Electrochem. Soc., vol. 137, No. 6, Jun. 1990, pp. 1887-1892.

* cited by examiner

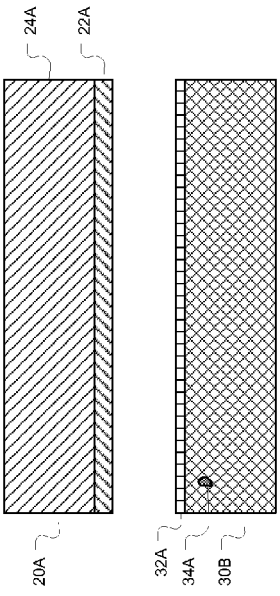
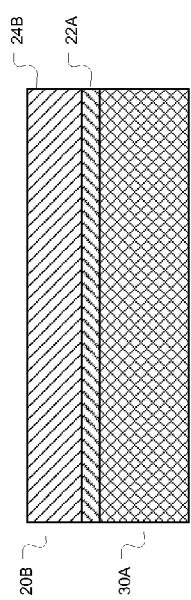
FIGURE 2A  FIGURE 2B  FIGURE 2C
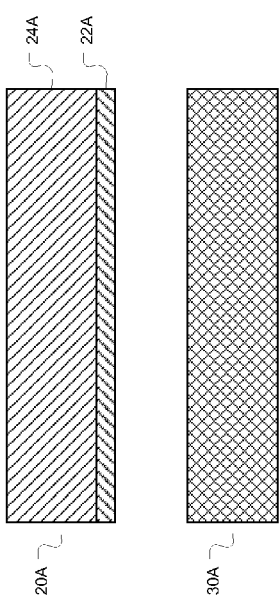
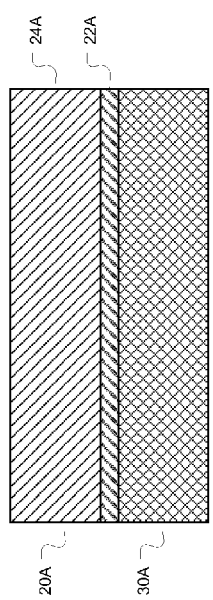
FIGURE 1A  FIGURE 1B  FIGURE 1C

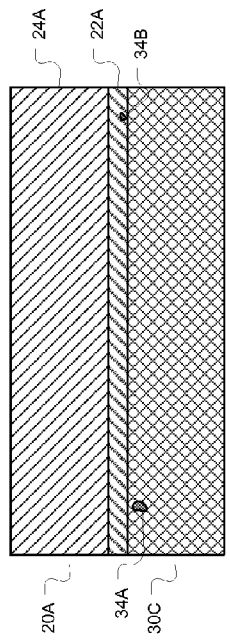
FIGURE 3A
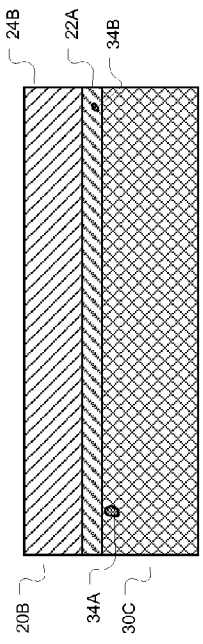
FIGURE 3D
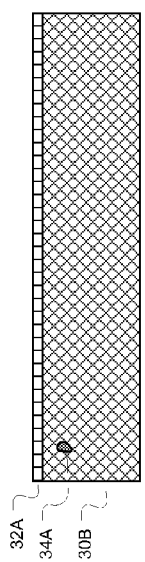
FIGURE 3B
FIGURE 3C
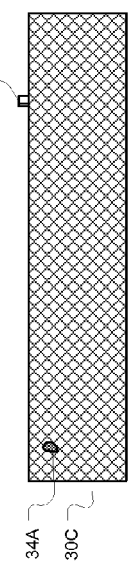
FIGURE 3E
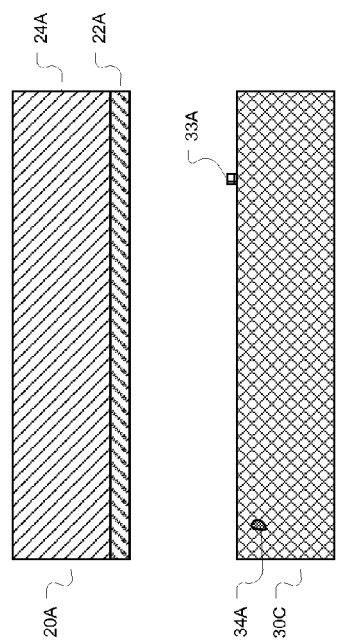

| Clean Step | Temperature (Celsius) | Time (minutes) | Chemical Composition | | | | | | |
|---|---|---|---|---|---|---|---|---|---|
| | | | H₂O | H₂SO₄ | H₂O₂ | NH₄OH | HCl | HF | HNO₃ |
| SPM | 140 | 10 | | 99% | 1% | | | | |
| SC1 | 55 | 10 | 82% | | 17% | 1% | | | |
| SC2 | 55 | 10 | 99% | | | | 1% | | |
| SC2+ | 55 | 10 | 90% | | | | 10% | | |
| SC2+/H₂O₂ | 55 | 10 | 84% | | 8% | | 8% | | |
| Nitric | 25 | 2 | 50% | | | | | | 50% |
| HF/Nitric | 30 | 5 | | | | | | 50% | 50% |
| Megasonics | 25 | 10 | 92% | | 3% | 5% | | | |

FIGURE 5D

| Cleaning Process | Surface Iron Concentration* | |
|---|---|---|
| | pre | post |
| SPM | 14.2 | 10.4 |
| SPM-SC1-SC2 | 13.4 | 9.5 |
| SPM-SC1-SC2+ | 29.3 | 2.9 |
| SPM-SC1-SC2+/H₂O₂ | 7.9 | 2.4 |
| SPM-SC2+/H₂O₂-SC1 | 6.8 | 2.6 |
| SPM-SC2+/H₂O₂-Megasonic | 12.2 | 2.2 |
| SPM-Nitric | 9.7 | 4.5 |
| SPM-HF/Nitric | 5.6 | 4.3 |

FIGURE 5E

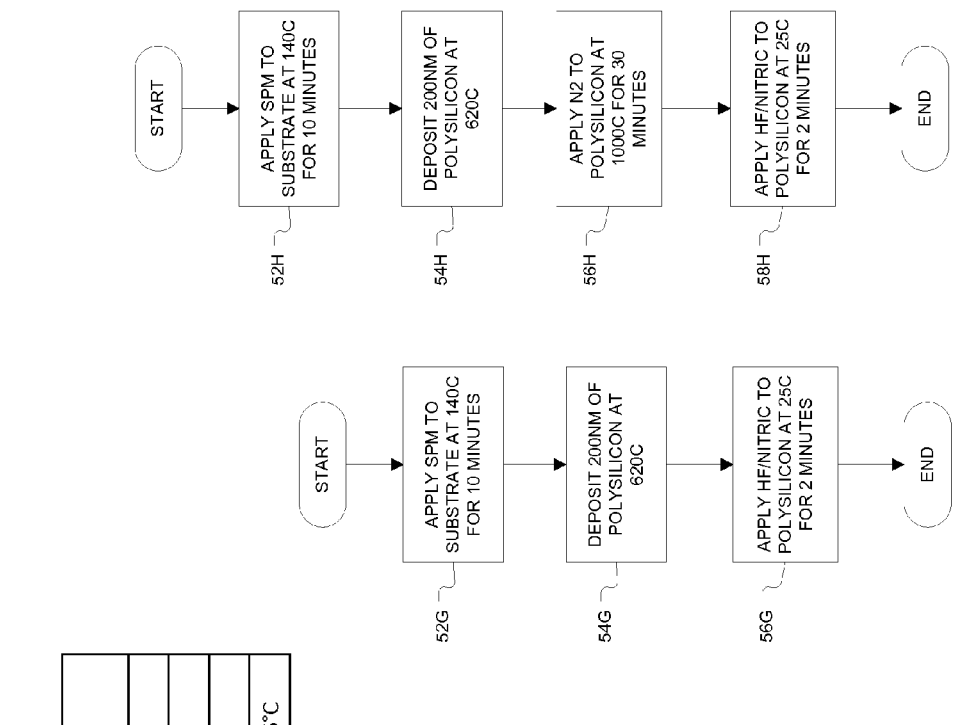

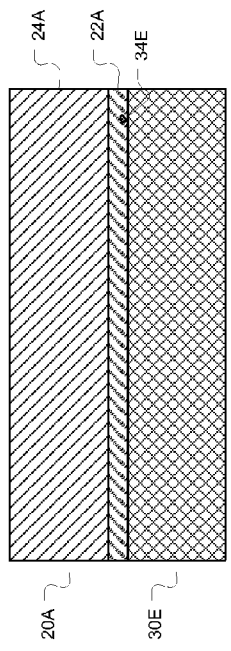
FIGURE 6A
FIGURE 6B
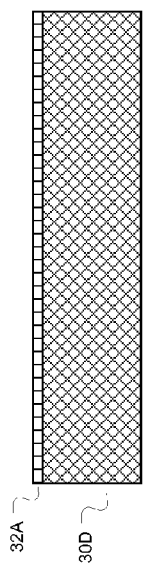
FIGURE 6D
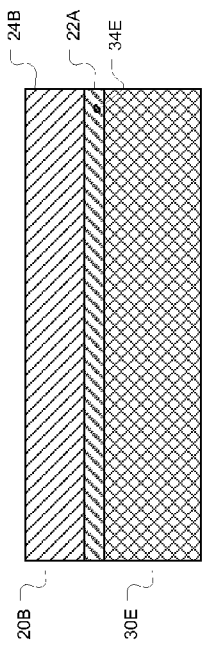
FIGURE 6C
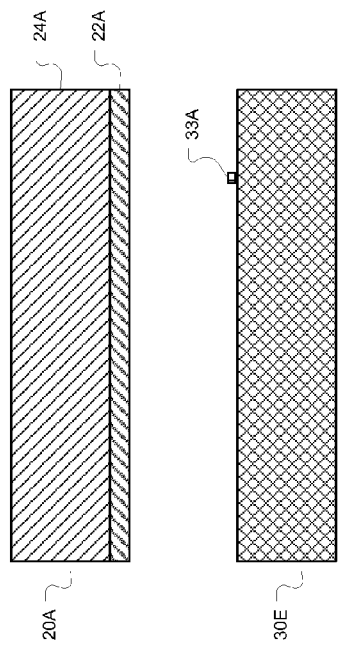
FIGURE 6E

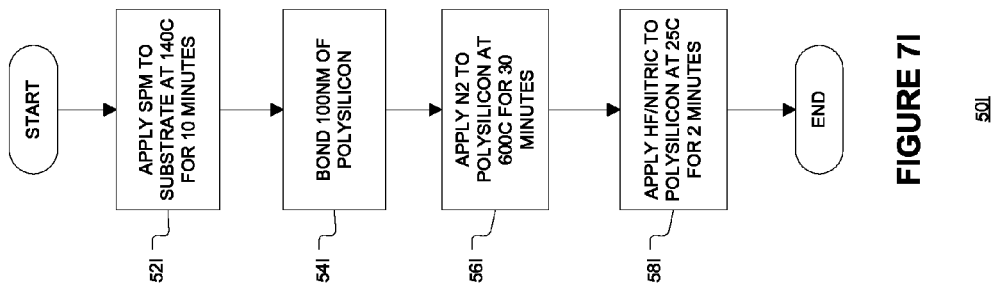
FIGURE 7I
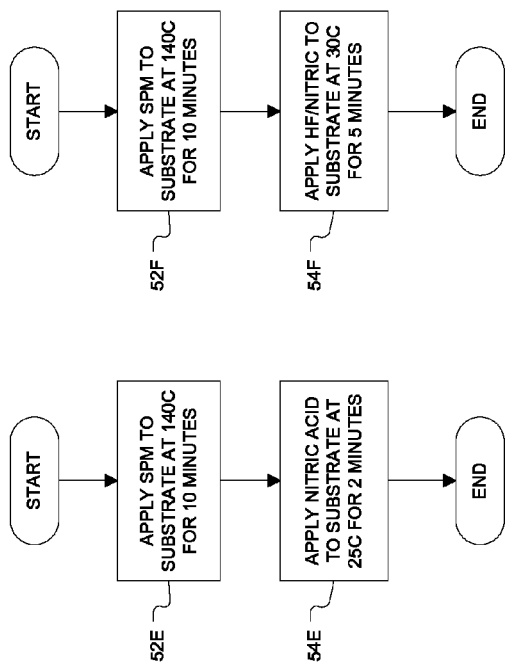
FIGURE 7F
FIGURE 7E
FIGURE 5G

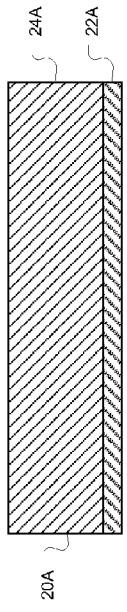
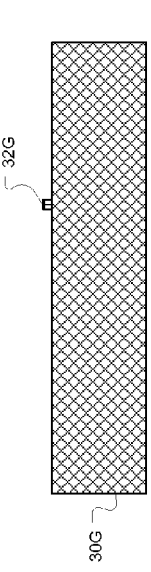
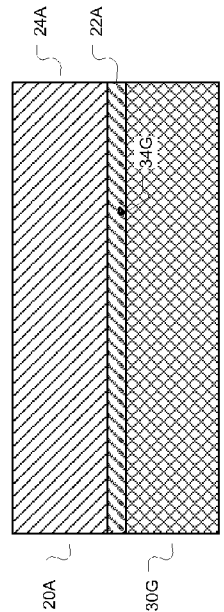
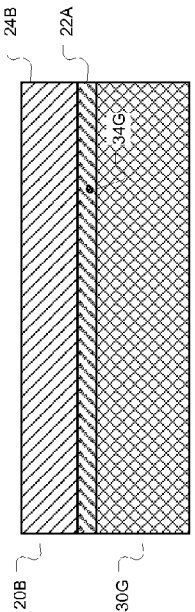
FIGURE 8E  FIGURE 8F  FIGURE 8G
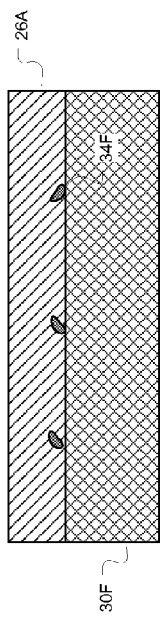
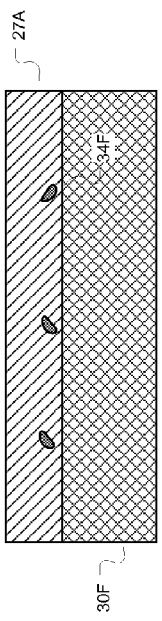
FIGURE 8A  FIGURE 8B  FIGURE 8C  FIGURE 8D

METHOD, SYSTEM, AND APPARATUS FOR PREPARING SUBSTRATES AND BONDING SEMICONDUCTOR LAYERS TO SUBSTRATES

CROSS REFERENCE TO RELATED APPLICATIONS

This application claims priority under 35 USC 119 to U.S. provisional application No. 61/732,290 filed Nov. 30, 2012 and entitled "METHOD, SYSTEM, AND APPARATUS FOR PREPARING SUBSTRATES AND BONDING SEMICONDUCTOR LAYERS TO SUBSTRATES", the entire contents of which is hereby incorporated herein by reference.

TECHNICAL FIELD

Various embodiments described herein relate generally to preparing a substrate for subsequent bonding to one or more semiconductor layers.

BACKGROUND INFORMATION

It may be desirable to prepare a substrate prior to bonding the substrate to a semiconductor, the preparation may include reducing one or more surface contaminants and reducing substrate damaged surface layers, the present invention provides a system, method, and apparatus for same.

BRIEF DESCRIPTION OF THE DRAWINGS

FIG. 1A is a simplified sectional diagram of a semiconductor fabrication architecture at a first fabrication stage according to various embodiments.

FIG. 1B is a simplified sectional diagram of a semiconductor fabrication architecture at a second fabrication stage according to various embodiments.

FIG. 1C is a simplified sectional diagram of a semiconductor fabrication architecture at a third fabrication stage according to various embodiments.

FIG. 2A is a simplified sectional diagram of a semiconductor fabrication architecture at a first fabrication stage, the substrate including surface contaminants and embedded contaminants or damaged surface layers (diffuse substrate) according to various embodiments.

FIG. 2B is a simplified sectional diagram of a semiconductor fabrication architecture at a second fabrication stage, the diffuse substrate including reduced surface contaminants or damaged surface layers according to various embodiments.

FIG. 2C is a simplified sectional diagram of a semiconductor fabrication architecture at a third fabrication stage, the diffuse substrate including embedded and surface contaminants or damaged surface layers according to various embodiments.

FIG. 3A is a simplified sectional diagram of a semiconductor fabrication architecture at a first fabrication stage, the substrate including surface contaminants and embedded contaminants or damaged surface layers (diffuse substrate) according to various embodiments.

FIG. 3B is a simplified sectional diagram of a semiconductor fabrication architecture at a second fabrication stage after substrate preparation, the processed, diffuse substrate including reduced surface contaminants or damaged surface layers according to various embodiments.

FIG. 3C is a simplified sectional diagram of a semiconductor fabrication architecture at a third fabrication stage after substrate preparation, the processed, diffuse substrate including reduced surface contaminants or damaged surface layers according to various embodiments.

FIG. 3D is a simplified sectional diagram of a semiconductor fabrication architecture at a fourth fabrication stage after substrate preparation, the processed, diffuse substrate including reduced surface contaminants or damaged surface layers according to various embodiments.

FIG. 3E is a simplified sectional diagram of a semiconductor fabrication architecture at a fifth fabrication stage after substrate preparation, the processed, diffuse substrate including reduced surface contaminants or damaged surface layers according to various embodiments.

FIG. 5D is a chart of various surface contaminant cleaning protocols according to various embodiments.

FIG. 5E is a chart of before and after surface contaminant levels after different cleaning protocols are applied according to various embodiments.

FIG. 5F is a chart of different cleaning protocols according to various embodiments.

FIG. 5G is a chart of a cleaning protocol according to various embodiments.

FIG. 6A is a simplified sectional diagram of a semiconductor fabrication architecture at a first fabrication stage, the substrate including surface contaminants but not diffuse enough to include embedded contaminants (non-diffuse substrate) according to various embodiments.

FIG. 6B is a simplified sectional diagram of a semiconductor fabrication architecture at a second fabrication stage after substrate preparation, the processed, non-diffuse substrate including reduced surface contaminants according to various embodiments.

FIG. 6C is a simplified sectional diagram of a semiconductor fabrication architecture at a third fabrication stage after substrate preparation, the processed, non-diffuse substrate including reduced surface contaminants according to various embodiments.

FIG. 6D is a simplified sectional diagram of a semiconductor fabrication architecture at a fourth fabrication stage after substrate preparation, the processed, non-diffuse substrate including reduced surface contaminants according to various embodiments.

FIG. 6E is a simplified sectional diagram of a semiconductor fabrication architecture at a fifth fabrication stage after substrate preparation, the processed, non-diffuse substrate including reduced surface contaminants according to various embodiments.

FIG. 7A to 7I are flow diagrams of surface contamination reduction methods according to various embodiments.

FIG. 8A is a simplified sectional diagram of a semiconductor fabrication architecture at a first fabrication stage, the substrate including surface contaminants but not diffuse enough to include embedded contaminants (non-diffuse substrate) according to various embodiments.

FIG. 8B is a simplified sectional diagram of a semiconductor fabrication architecture at a second fabrication stage including a deposited silicon layer on the non-diffuse substrate according to various embodiments.

FIG. 8C is a simplified sectional diagram of a semiconductor fabrication architecture at a third fabrication stage including an annealedsilicon layer according to various embodiments.

FIG. 8D is a simplified sectional diagram of a semiconductor fabrication architecture at a fourth fabrication stage after substrate preparation, the processed, non-diffuse substrate including reduced surface contaminants according to various embodiments.

FIG. 8E is a simplified sectional diagram of a semiconductor fabrication architecture at a fifth fabrication stage, the processed, non-diffuse substrate including reduced surface contaminants according to various embodiments.

FIG. 8F is a simplified sectional diagram of a semiconductor fabrication architecture at a sixth fabrication stage, the processed, non-diffuse substrate including reduced surface contaminants according to various embodiments.

FIG. 8G is a simplified sectional diagram of a semiconductor fabrication architecture at a seventh fabrication stage, the processed, non-diffuse substrate including reduced surface contaminants according to various embodiments.

DETAILED DESCRIPTION

FIG. 1A is a simplified sectional diagram of a semiconductor fabrication architecture 10A at a first fabrication stage according to various embodiments. As shown in FIG. 1A architecture 10A may include a substrate 30A and one or more semiconducting layers 20A. In an embodiment the semiconductor layers 20A may include multiple, different layers 22A, 24A. As shown in FIG. 1A the substrate and semiconductor layers 20A may be formed separately and then bonded together using temperature, pressure or other substrate-semiconductor 30A, 20A bonding techniques as shown in FIG. 1B.

In a further embodiment after bonding the substrate 30A to the semiconducting layers 20A, a segment of semiconductor layer 20A may be annealed and then reduced in thickness via a chemical or mechanical process. As shown in FIG. 1C, the outer, semiconductor layer 24A may be reduced in thickness to semiconductor layer 24B thickness. In an embodiment the semiconductor layer 20A may include a single layer 24A. In the embodiment the semiconductor, insulating layer 22A may act as a stress layer between the substrate 30A and the semiconductor layer 24A.

Figure 9C:
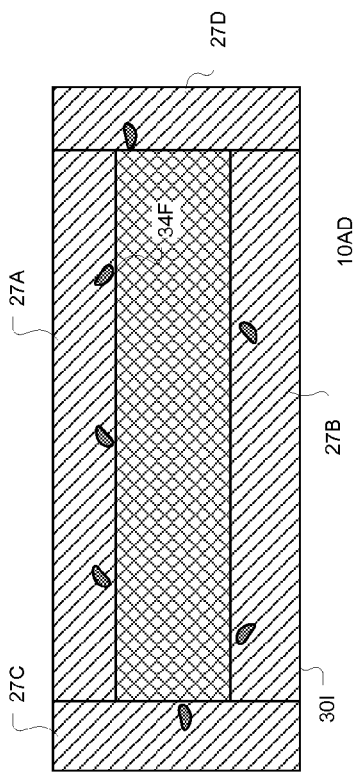
FIG. 9C is a simplified sectional diagram of a semiconductor fabrication architecture at a third fabrication stage including annealed silicon layers according to various embodiments.
Figure 9D:
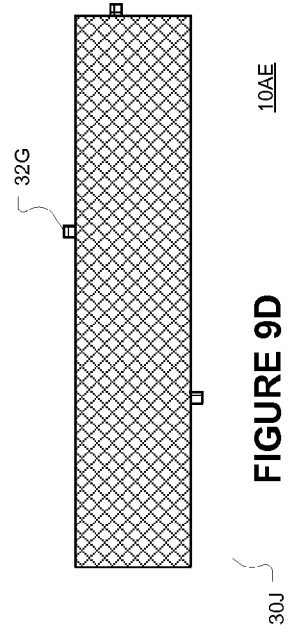
FIG. 9D is a simplified sectional diagram of a semiconductor fabrication architecture at a fourth fabrication stage after substrate preparation, the processed, non-diffuse substrate including reduced surface contaminants according to various embodiments.
Figure 9A:
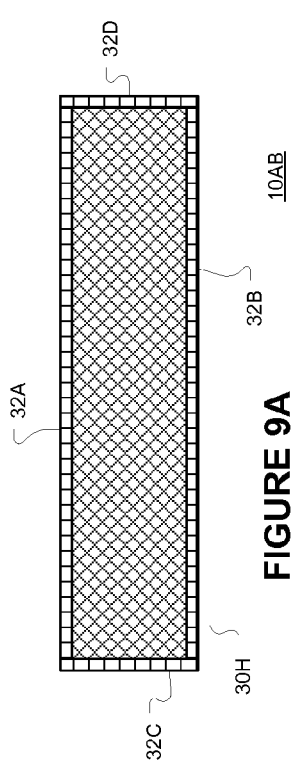
FIG. 9A is a simplified sectional diagram of a semiconductor fabrication architecture at a first fabrication stage, the substrate including surface contaminants but not diffuse enough to include embedded contaminants (non-diffuse substrate) according to various embodiments.

In an embodiment contaminants or surface damage 32A may be present on one or more surfaces of a substrate 10D as shown in FIG. 2A and contaminants 32A, 32B, 32C, and 32D on substrate 30G as shown in FIG. 9A. Due to manufacturing, Chemical Mechanical Planarization (CMP) or polish, and handling a substrate 10D may include layers of surface damage or imperfections. A substrate 10D surface may be annealed to remove damaged surface imperfections or layers. For a sapphire substrate, the surface 32A may be subject to annealing in inert gas at about 1000 degrees Celsius.

Further, as a function of the contaminant and substrate material, contaminants 34A may be present within or embedded in a substrate 30B as shown FIG. 2A. As shown in FIG. 2A the substrate may be formed separately and then bonded together using temperature, pressure or other substrate-semiconductor 30B, 20A bonding techniques as shown in FIG. 2B. As also shown in FIG. 2B, the bonding process may cause contaminants to diffuse into and form within the semiconductor layer 20A, in particular layer 22A, the insulating layer of the semiconductor 20A.

Depending on the substrate 30B material's diffusion characteristics relative to the contaminants, contaminants may also diffuse into the substrate 30B or from the substrate 30B into the semiconductor layer 20A. As shown in FIG. 2C in an embodiment the semiconductor layer 20A may be annealed and reduced in thickness via a chemical (etch) or mechanical process (grind/polish) 20B. The annealing (heating) process may cause further containment diffusion including into the upper semiconductor 20B layer 24B as shown in FIG. 2C. Depending on the contaminant 34A material in the bonded substrate-semiconductor layers architecture 10E (FIG. 2B) or 10F (FIG. 2C), resultant semiconductors formed out of architecture 10E, 10F may not function within desired parameters. In addition the contaminants may affect some semiconductor configurations more adversely. For example a MOSFET device threshold voltage may be adversely affected by contaminant material disposed in a semiconductor layer 20A.

In order to reduce contaminant material or remove damaged surface layers (of a substrate surface) in semiconductor architecture cleaning protocols and preparation processes have been developed. As noted in order to remove damaged surface layers of a substrate surface, the surface 32A may be annealed. In order to reduce contaminant materials during fabrication, certain substrate materials 30B with certain contaminant materials 32A as shown in FIG. 3A may be cleaned, prepared, or processed using one or more standard cleans (see SC1 and SC2 in column 42A of FIG. 5D). A standard clean SC1, SC2 may be applied to the substrate material 30B in an embodiment to reduce the contaminant material surface concentration 32A to 33A as shown in FIG. 3B. Embedded contaminant material 34A may not be affected or reduced by a standard clean SC1, SC2 process.

Then desired semiconductor architecture 10K may be fabricated by bonding the prepared substrate material 30C with one or more semiconductor layers 20A as shown in FIG. 3C. The resultant bonded semiconductor architecture 10K may include some contaminant material 34B (as shown in FIG. 3D) but the contaminant material concentration may be reduced as a function of the substrate material and contaminant material. The semiconductor layer 20A of architecture 10K may be annealed and reduced in thickness to produce semiconductor layer 20B of architecture 10L of FIG. 3E in an embodiment.

In a further embodiment after bonding the substrate 30A to the semiconducting layers 20A, a segment of semiconductor layer 20A may be reduced and annealed. As shown in FIG. 1C, the outer, semiconductor layer 24A may be reduced in thickness to semiconductor layer 24B thickness. The substrate material's chemical characteristics may also enable some undesirable contaminant material to diffuse within the substrate 30B and reduce its concentration near the semiconductor surface layer 20A. It is noted that the standard cleans SC1, SC2 effectiveness is dependent on the substrate material and contaminant material and were developed primarily for Silicon (Si) substrates.

Depending on the semiconductor development or usage environment, other less diffuse substrate materials may be employed. In a high radiation environment such in communication devices, a semiconductor device may need a substrate with less diffuse properties and greater insulation than standard Silicon (Si) substrates where an Si substrate may have a binding energy of about 3 eV. Similarly the semiconductor layer 20A may be comprised of a material different than the substrate 30D (non-homogeneous versus a heterogeneous semiconductor architecture) and may include piezoelectric materials. In an embodiment, the substrate material 30D shown in FIG. 4A may be substantially non-diffuse relative to contaminant materials while the semiconductor layer 20A may be diffuse relative to contaminant materials. In an embodiment, a contaminant material may be any material that degrades performance of the resultant architecture.

In an embodiment the contaminants may include transition metals, Alkali metals, non-metals, and metalloids. The transition metals may include Scandium (Sc, periodic table 21), Titanium (Ti, 22), Vanadium (V, 23), Chromium (Cr, 24), Manganese (Mn, 25), Iron (Fe, 26), Cobalt (Co, 27), Nickel (Ni, 28), Copper (Cu, 29), and Zinc (Zn, 30). The Alkali metals may include Sodium (Na, 11) and Potassium (K, 19), Rubidium (Rb, 37), Caesium (Cs, 55), and Francium (Fr, 87). The non-metals may include Hydrogen (H, 1), Carbon (C, 6), Nitrogen (N, 7), Phosphorus (P, 15), Oxygen (O, 8), Sulfur (S, 16), Selenium (Se, 34), Fluorine (F, 9), Chlorine (Cl, 17), Bromine (Br, 35), Iodine (I, 53), Astatine (At, 85). The metalloids may include Boron (B, 5), Silicon (Si, 14), Geranium (Ge, 32), Arsenic (As, 33), Antimony (Sb, 51), and Tellurium (Te, 52).

In an embodiment, processing material may remain on a substrate surface during process and capture the impurity contaminants: transition metals, Alkali metals, non-metals, and metalloids. Some of these contaminants are difficult to remove using standard cleaning processes including dried $SiO_2$, C, Ca, and P. It is noted that once P gets bound onto a substrate surface, it is difficult to fully remove. Dried $SiO_2$ may be left on a substrate from a $SiO_2$ slurry, where the slurry turns into cement when dried. Applied waxes may leave a carbon (C) based polymer. Calcium (Ca) may be result from ingots or applied water.

In an embodiment, the substrate 30D of architecture 10M may include substantially non-diffuse, insulating material having a binding energy greater than 50 eV. The substrate 30D may be comprised of $Al_2O_3$ (Sapphire) (about 74 eV binding energy), $MgAl_2O_4$ (Spinel), SiC (Silicon Carbide) (about 287 eV binding energy), AlN (Aluminum nitride), high pressure and high temperature (HPHT) diamond, chemical vapor deposition (CVD) diamond, $Al_2O_3$ (Alumina substrate), and $ZrO_2$ (Zirconia substrate). It is noted that these substrate materials may also have a greater surface electrostatic force making removal of contaminant materials more difficult than Si based substrates.

As noted the conducting or electrically active layer may include a semiconductor material or piezoelectric material. The semiconductor material may include Silicon (Si), Gallium (Ga), Gallium Arsenide (GaAs), Gallium Nitride (GaN), Silicon Carbide (SiC), and Alumina Gallium Nitride (AlGaN). The piezoelectric material may include Lithium Niobate ($LiNbO_3$), Lithium Tantalate ($LiTaO_3$), and Strontium Titanate ($SrTiO_3$).

In an embodiment the electrically active layer 20A may be formed of material of the same chemical group as the substrate material to form a homogeneous architecture. In another embodiment the electrically active layer 20A may be formed of material of a different chemical group as the substrate material to form a heterogeneous architecture. For example a homogeneous device may include a substrate material formed from Si and the electrically active layer may include a material formed from Si. In an embodiment a heterogeneous device substrate may include $Al_2O_3$, $MgAl_2O_4$, SiC, AlN, HPHT diamond, CVD diamond, $Al_2O_3$, and $ZrO_2$ and the electrically active layer may include Silicon (Si), Gallium (Ga), Gallium Arsenide (GaAs), Gallium Nitride (GaN), Silicon Carbide (SiC), and Alumina Gallium Nitride (AlGaN).

Figure 4A:
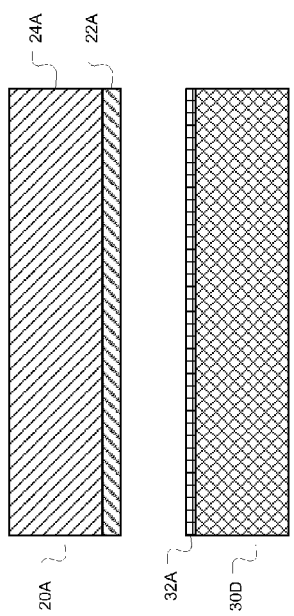
FIG. 4A is a simplified sectional diagram of a semiconductor fabrication architecture at a first fabrication stage, the substrate not diffuse enough to contain embedded contaminants (non-diffuse) according to various embodiments.
Figure 4B:
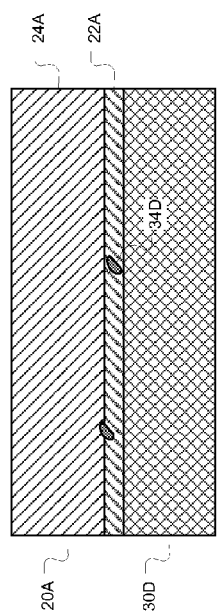
FIG. 4B is a simplified sectional diagram of a semiconductor fabrication architecture at a second fabrication stage with a non-diffuse substrate according to various embodiments.

FIG. 4A is simplified sectional diagram of semiconductor architecture 10M where the substrate 30D material is substantially non-diffuse for one or more contaminant materials 32A or includes surface layer imperfections or damage. As shown in FIG. 4A due to the low diffusion properties of the substrate material 30D, contaminant material 32A may primarily exist on the substrate 30D surface. As shown in 9A, contaminant material 32A, 32B, 32C, 32D (and surface layer imperfections or damage) may be present on all surfaces of the substrate 30H. The electrically active layer 20A due to its ability to be at least partially conductive is diffuse relative to the substrate 30D. Accordingly, when the electrically active layer 20A is bonded to the substrate 30D, contaminant material 32A on the substrate 30D surface may form particulates 34D within the electrically active layer 20A as shown in FIG. 4B.

Figure 4C:
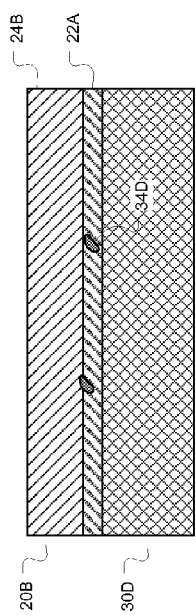
FIG. 4C is a simplified sectional diagram of a semiconductor fabrication architecture at a third fabrication stage with a non-diffuse substrate according to various embodiments.

In an embodiment the electrically active layer 20A may be annealed and its thickness reduced (via a chemical or mechanical process) to form an electrically active layer 20B for architecture 100 shown in FIG. 4C. The annealing process may cause one or more particulates to migrate or diffuse further into the electrically active layer 20B. It is noted that the contaminant materials 34D may degrade the performance of a device generated from architecture 100. In an embodiment the substrate 30D may consist primarily of sapphire ($Al_2O_3$), the electrically active layer 20A may include a first semiconductor, insulating layer 22A consisting primarily of $SiO_2$ (silicon oxide) and the second, adjacent semiconducting layer 24A may include Silicon. The contaminant material 32A may include iron oxide ($Fe_2O_3$, $Fe_3O_4$ or other) (one of many types of contaminants including transition metals, Alkali metals, non-metals, and metalloids). When substrate 30D (sapphire) is bonded with the semiconductor layer 20A, substrate 30D surface contaminants 32A may form iron silicide ($FeSi_2$) particulates 34A in the semiconductor layer 20A first semiconductor, insulating layer 22A. Iron may combine with Silicon Oxide to produce iron silicide particulates 34A in an embodiment.

It is noted that iron silicide particulates 34A are conductive and may cause a semiconductor device including a particulate 34A to operate improperly (creating conduction channels in a semiconductor layer 24B, 24C or insulating layer 22A, 22C (FIG. 5A)). Further, the iron silicide particulates 34A may not initially affect a semiconductor device's operation but migrate due to temperature and later cause failure of a semiconductor device (latent defect). A semiconductor device including iron silicide particulates 34A may also have crystal defects as shown in FIG. 5A and create diffusion pipes.

Figure 5A:
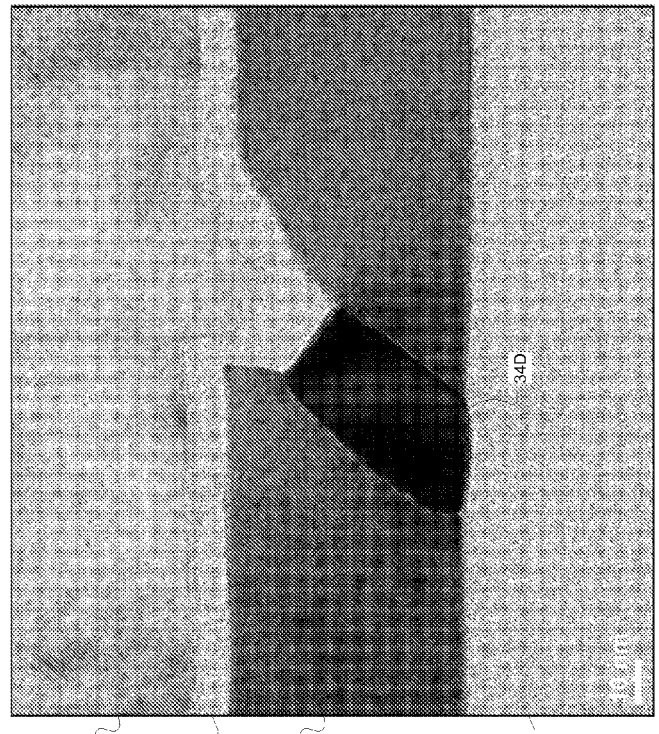
FIG. 5A is an image of a semiconductor fabrication architecture segment at a third fabrication stage, the substrate not diffuse enough to contain embedded contaminants according to various embodiments.

FIG. 5A is an image of a bonded semiconductor fabrication architecture segment 40A according to various embodiments. The segment 40A is similar to architecture 100 shown in FIG. 4C. The segment 40A includes a semiconductor section 20C. In an embodiment, the semiconductor section 20C includes four adjacent layers 22A, 24B, 22C, and 24C. Layers 22A and 22C are insulating layers and layers 24B and 24C are semiconducting layers. In an embodiment the insulating layers 22A, 22C may be formed of Silicon Oxide. The semiconductor layers 24B, 24C may be formed of a polysilicon or silicon.

As shown in FIG. 5A, the segment 40A of semiconductor section 20C may include iron silicide particulates 34D. A particulate 34D may be embedded in the semiconducting layer 24B adjacent the insulting layer 22A. As shown in FIG. 5A the particulates 34D may also cause crystal defects and diffusion pipes between a semiconducting layer 24B and an adjacent insulating layers 22A or 22C.

Figures 5B, 5C:
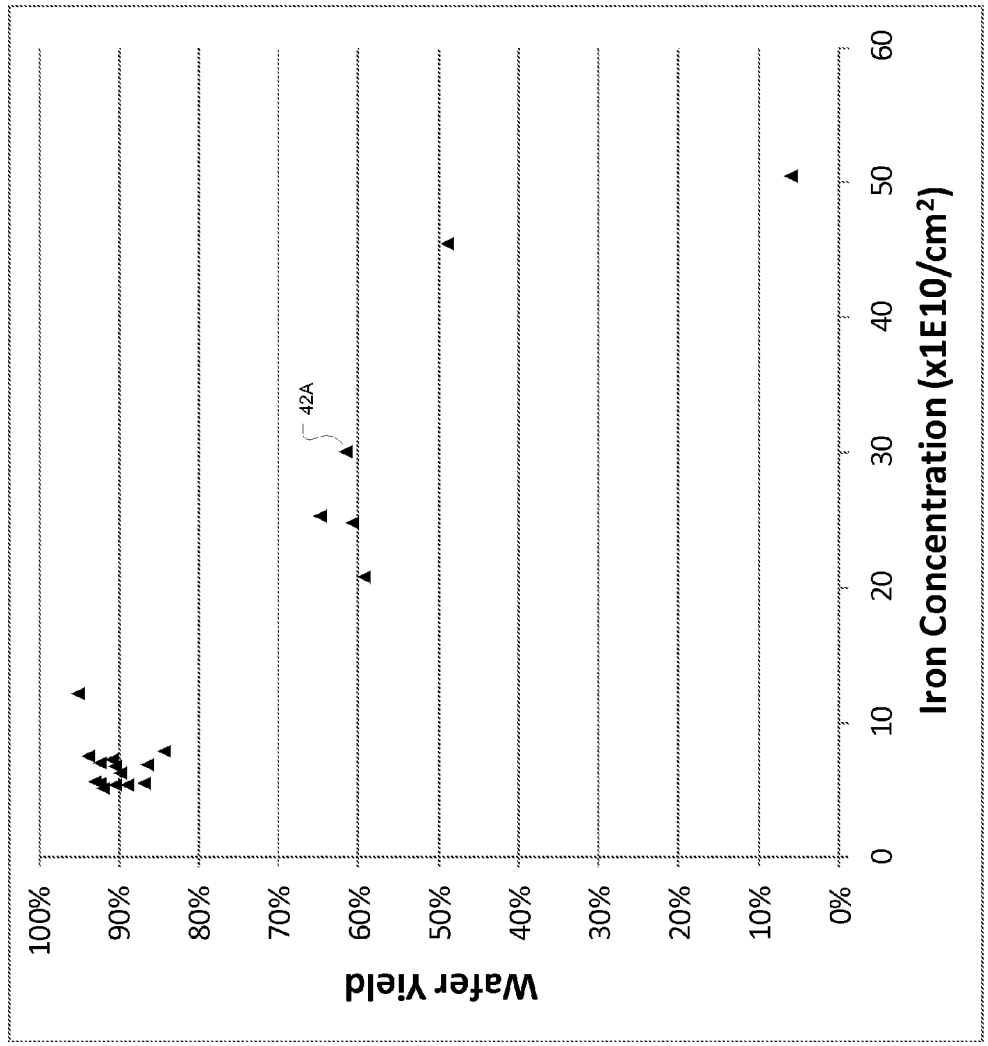
FIG. 5B is a chart of surface contaminant density versus semiconductor wafer fabrication yield according to various embodiments.
FIG. 5C is a plot of surface contaminant density versus semiconductor wafer fabrication yield according to various embodiments.

Iron, iron oxide, and other contaminants including transition metals, Alkali metals, non-metals, and metalloids may be introduced to substrate 30D surfaces during substrate processing including cutting sapphire into wafers and processing (including CMP) the sapphire wafers to provide sapphire discs with a desired thickness and area for use as a substrate 30D in architecture 10M and may also create surface layer damage. The surface concentration of unwanted contaminant material may affect the volume of unwanted particulates 34D. FIG. 5B is a chart 40B of surface iron contaminant density versus semiconductor wafer fabrication yield according to various embodiments and FIG. 5C is a plot 40C of surface iron density contaminant density versus semiconductor wafer fabrication yield 42A according to various embodiments.

As shown in FIGS. 5B and 5C, Applicants have determined that iron concentrations as low as 7 1E10 atoms/cm$^2$ ($7\times10^{10}$ atoms/cm$^2$) may reduce wafer production by about 14% and concentrations at 24.9 1E10/cm2 ($24.9\times10^{10}$ atoms/cm$^2$) may reduce wafer production by about 40%. The wafers in the studies included a sapphire substrate 30D and Silicon based semiconducting layers 20A. In order to reduce the contaminant material density one or more cleaning processes according to the present invention may be applied as shown in FIGS. 6A to 6E. FIG. 6A to 6E are similar to FIGS. 3A to 3E and represent wafer fabrication including a cleaning stage (shown in FIG. 6B) where the original surface contaminant density 32A (show in FIG. 6A) is reduced to 33A as shown in FIG. 6C. Substrate 30D of FIG. 6A is a substantially non-diffuse material to the contaminant material 32A. In addition the substrate 30D may have a large electrostatic energy on its surface making contaminant material reduction problematic with standard cleans SC1, SC2 (see FIG. 5D).

As shown in FIG. 5D Applicants have developed other chemical based cleaning protocols to reduce surface contaminants on non-diffuse substrates 30D. The cleaning protocols 40D shown in FIG. 5D may be applied to sapphire substrate including unwanted iron concentrations on its surface. FIG. 5D defines different chemical cleaning protocols according to the present invention. Column 42A defines the process label including SPM (sulfuric acid ($H^2SO^4$) and hydrogen peroxide ($H^2O^2$) mixture), SC1 (standard clean 1), SC2 (standard clean 2), SC2+ (standard clean 2 plus), SC2+/H$^2$O$^2$ (standard clean 2 plus and hydrogen peroxide), Nitric (Nitric acid (HNO$^3$), HF/Nitric (Hydrofluoric Acid (HF) and Nitric Acid (HNO$^3$)), and Megasonics (chemical and acoustic cleaning). The second column 42B defines the temperature in Celsius of the environment about the substrate during the cleaning process. The third column 42C defines the time the cleaning agent is applied to the substrate 30D.

The remaining columns 42D define the chemical composition of the mixture or solution to be applied to the substrate 30D for the defined time 42C and temperature 42B for different cleaning protocols 42A. FIG. 5E is a chart of before and after surface iron contaminant levels after different cleaning protocols are applied according to various embodiments. As shown in FIG. 5E, column 44A lists the cleaning protocols from FIG. 5D to be applied to a substrate 30D to reduce surface contaminant density, in particular metal type contaminants including iron. The second and third columns 44B list measured surface concentrations of iron atoms on a sapphire substrate before and after cleaning protocols 44A are applied.

Figure 7D:
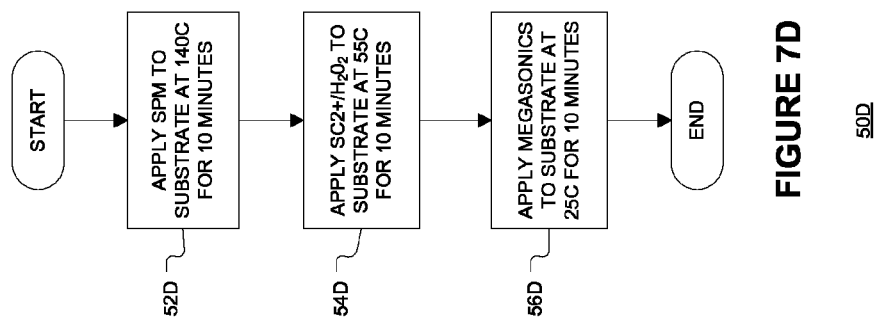
Figure 7C:
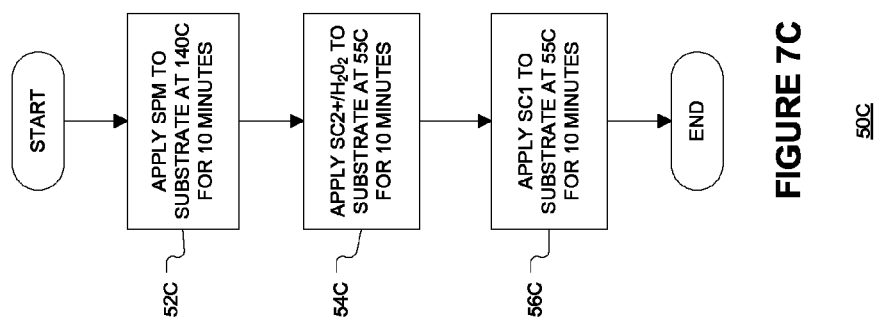

As shown in FIG. 5E, after using the SPM (sulfuric acid ($H^2SO^4$) and hydrogen peroxide ($H^2O^2$) mixture) cleaning protocol the iron concentration is only lowered about 4 1E10/cm2 ($4\times10^{10}$ atoms/cm$^2$) (first row of FIG. 5E). Further, employing cleaning protocols SPM, SC1, and SC2 as defined in 5D only reduces a surface iron atom concentration on a sapphire substrate by about 4 1E10/cm2 ($4\times10^{10}$ atoms/cm$^2$) (row 2 of FIG. 5E). The cleaning process (SPM-SC1-SC2+) defined in row three of FIG. 5E and shown in FIG. 7A 50A (process), however reduces a surface iron atom concentration on a sapphire substrate by 26 1E10/cm2 ($26\times10^{10}$ atoms/cm$^2$) (from $29.3\times10^{10}$ atoms/cm$^2$ to $2.9\times10^{10}$ atoms/cm$^2$). FIG. 7A is a flow diagram of the cleaning process (SPM-SC1-SC2+) ($3^{rd}$ row of FIG. 5E). As shown in FIG. 7A in the process 50A a SPM is applied to a substrate at 140° C. for 10 minutes where the SPM has a ratio of 99% sulfuric acid ($H^2SO^4$) and 1% hydrogen peroxide ($H^2O^2$) (activity 52A).

Then the standard clean 1 (SC1) is applied to the substrate at 55° C. for 10 minutes where the SC1 chemical composition includes 82% distilled water ($H_2O$), 17% hydrogen peroxide ($H_2O_2$), and 1% Ammonium Hydroxide solution ($NH_4OH$) (activity 54A). After the standard clean 1 (SC1) is applied to the substrate, standard clean 2 plus (SC2+) is applied to the substrate at 55° C. for 10 minutes where the SC2+ chemical composition includes 90% distilled water ($H_2O$) and 10% Hydrochloric acid (HCl) (activity 56A). The SPM-SC1-SC2+ process 50A shown in FIG. 7A and defined in FIGS. 5D and 5E reduces surface iron atom concentration on a sapphire substrate by 26 1E10/cm2 ($26\times10^{10}$ atoms/cm$^2$).

Figure 7B:
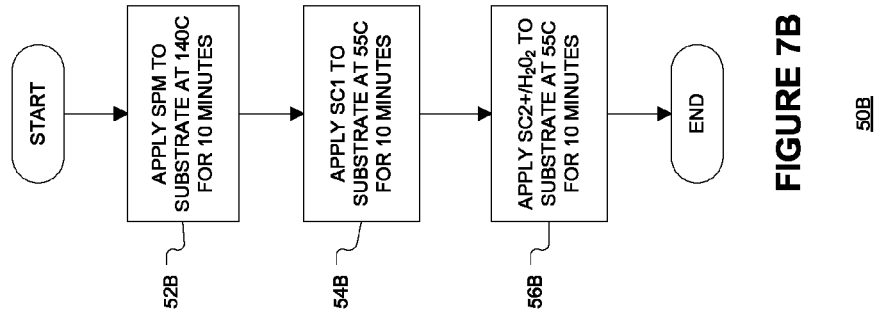
Figure 7A:
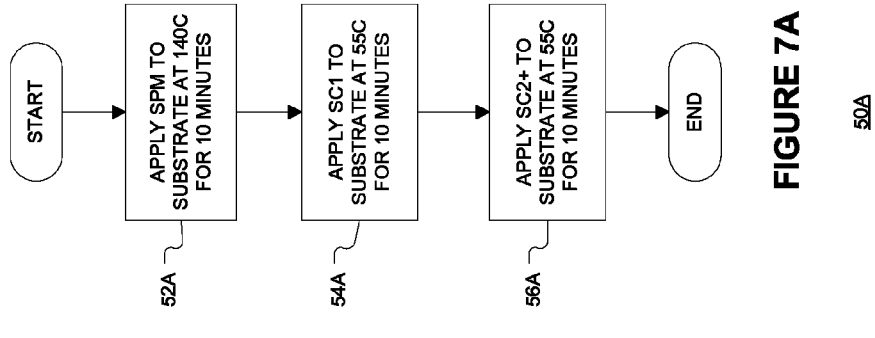

Another cleaning process according to an embodiment of the present invention, cleaning process (SPM-SC1-SC2+/H$_2$O$_2$) defined in row four of FIG. 5E and shown in FIG. 7B 50B, reduces a surface iron atom concentration on a sapphire substrate by 5 1E10/cm2 ($5\times10^{10}$ atoms/cm$^2$) to a total surface density of 2.4 1E10/cm2 ($2.4\times10^{10}$ atoms/cm$^2$). FIG. 7B is a flow diagram of the cleaning process (SPM-SC1-SC2+/H$_2$O$_2$) ($4^{rd}$ row of FIG. 5E). As shown in FIG. 7B in the process 50B a SPM is applied to a substrate at 140° C. for 10 minutes where the SPM has a ratio of 99% sulfuric acid ($H^2SO^4$) and 1% hydrogen peroxide ($H^2O^2$) (activity 52B).

Then the standard clean 1 (SC1) is applied to the substrate at 55° C. for 10 minutes where the SC1 chemical composition includes 82% distilled water ($H_2O$), 17% hydrogen peroxide ($H_2O_2$), and 1% Ammonium Hydroxide solution ($NH_4OH$) (activity 54A). After the standard clean 1 (SC1) is applied to the substrate, standard clean 2 plus/H$_2$O$_2$ (SC2+/H$_2$O$_2$) is applied to the substrate at 55° C. for 10 minutes where the SC2+/H$_2$O$_2$ chemical composition includes 84% distilled water ($H_2O$), 8% hydrogen peroxide ($H_2O_2$), and 8% Hydrochloric acid (HCl) (activity 56A). The HCl concentration is 8 times greater than a SC2 concentration. The SPM-SC1-SC2+/$H_2O_2$ process 50B shown in FIG. 7B and defined in FIGS. 5D and 5E reduces surface iron atom concentration on a sapphire substrate to 2.4 1E10/cm2 ($2.4 \times 10^{10}$ atoms/cm$^2$).

A further cleaning process according to an embodiment of the present invention, cleaning process (SPM-SC2+/$H_2O_2$-SC1) defined in row five of FIG. 5E and shown in FIG. 7C 50C, reduces a surface iron atom concentration on a sapphire substrate by 4 1E10/cm2 ($4 \times 10^{10}$ atoms/cm$^2$) to a total surface density of 2.6 1E10/cm2 ($2.6 \times 10^{10}$ atoms/cm$^2$). FIG. 7C is a flow diagram of the cleaning process (SPM-SC2+/$H_2O_2$-SC1) (5$^{rd}$ row of FIG. 5E). As shown in FIG. 7C in the process 50C a SPM is applied to a substrate at 140° C. for 10 minutes where the SPM has a ratio of 99% sulfuric acid ($H^2SO^4$) and 1% hydrogen peroxide ($H^2O^2$) (activity 52C).

Then standard clean 2 plus/$H_2O_2$ (SC2+/$H_2O_2$) is applied to the substrate at 55° C. for 10 minutes where the SC2+/$H_2O_2$ chemical composition includes 84% distilled water ($H_2O$), 8% hydrogen peroxide ($H_2O_2$), and 8% Hydrochloric acid (HCl) (activity 54C). The HCl concentration is 8 times greater than a SC2 concentration. After the standard clean 2 plus/$H_2O_2$ (SC2+/$H_2O_2$) is applied to the substrate a standard clean 1 (SC1) is applied to the substrate at 55° C. for 10 minutes where the SC1 chemical composition includes 82% distilled water ($H_2O$), 17% hydrogen peroxide ($H_2O_2$), and 1% Ammonium Hydroxide solution ($NH_4OH$) (activity 54A). The SPM-SC2+/$H_2O_2$-SC1 process 50C shown in FIG. 7C and defined in FIGS. 5D and 5E reduces surface iron atom concentration on a sapphire substrate to 2.6 1E10/cm2 ($2.6 \times 10^{10}$ atoms/cm$^2$).

Cleaning process (SPM-SC2+/$H_2O_2$-Megasonics), defined in row six of FIG. 5E and shown in FIG. 7D 50D, reduces a surface iron atom concentration on a sapphire substrate by 10 1E10/cm2 ($10 \times 10^{10}$ atoms/cm$^2$) to a total surface density of 2.2 1E10/cm2 ($2.2 \times 10^{10}$ atoms/cm$^2$). FIG. 7D is a flow diagram of the cleaning process (SPM-SC2+/$H_2O_2$-Megasonics) (6$^{th}$ row of FIG. 5E). As shown in FIG. 7D in the process 50D a SPM is applied to a substrate at 140° C. for 10 minutes where the SPM has a ratio of 99% sulfuric acid ($H^2SO^4$) and 1% hydrogen peroxide ($H^2O^2$) (activity 52D).

Then standard clean 2 plus/$H_2O_2$ (SC2+/$H_2O_2$) is applied to the substrate at 55° C. for 10 minutes where the SC2+/$H_2O_2$ chemical composition includes 84% distilled water ($H_2O$), 8% hydrogen peroxide ($H_2O_2$), and 8% Hydrochloric acid (HCl) (activity 54D). The HCl concentration is 8 times greater than a SC2 concentration. After the standard clean 2 plus/$H_2O_2$ (SC2+/$H_2O_2$) is applied to the substrate Megasonics and a solution is applied to the substrate at 25° C. for 10 minutes where the solution includes 92% distilled water ($H_2O$), 3% hydrogen peroxide ($H_2O_2$), and 5% Ammonium Hydroxide solution ($NH_4OH$) (activity 54A). The $NH_4OH$ concentration is 5 times greater than a SC1 concentration. Megasonics produces acoustic cavitation about 0.8-2 MHz. The SPM-SC2+/$H_2O_2$-Megasonics process 50D shown in FIG. 7D and defined in FIGS. 5D and 5E reduces surface iron atom concentration on a sapphire substrate to 2.2 1E10/cm2 ($2.2 \times 10^{10}$ atoms/cm$^2$).

Cleaning process (SPM-Nitric), defined in row seven of FIG. 5E and shown in FIG. 7E 50E, reduces a surface iron atom concentration on a sapphire substrate by 5 1E10/cm2 ($5 \times 10^{10}$ atoms/cm$^2$) to a total surface density of 4.5 1E10/cm2 ($4.5 \times 10^{10}$ atoms/cm$^2$). FIG. 7E is a flow diagram of the cleaning process (SPM-Nitric) (7$^{th}$ row of FIG. 5E). As shown in FIG. 7E in the process 50E a SPM is applied to a substrate at 140° C. for 10 minutes where the SPM has a ratio of 99% sulfuric acid ($H^2SO^4$) and 1% hydrogen peroxide ($H^2O^2$) (activity 52E).

Then Nitric (Nitric acid ($HNO^3$)) is applied to the substrate at 25° C. for 2 minutes where the Nitric chemical composition includes 50% distilled water ($H_2O$) and 50% Nitric acid ($HNO^3$) (activity 54E). The Nitric process 50E shown in FIG. 7E and defined in FIGS. 5D and 5E reduces surface iron atom concentration on a sapphire substrate to 4.5 1E10/cm2 ($4.5 \times 10^{10}$ atoms/cm$^2$).

Cleaning process (SPM-HF/Nitric), defined in row eight of FIG. 5E and shown in FIG. 7F 50F, reduces a surface iron atom concentration on a sapphire substrate by 1 1E10/cm2 ($1 \times 10^{10}$ atoms/cm$^2$) to a total surface density of 4.3 1E10/cm2 ($4.3 \times 10^{10}$ atoms/cm$^2$). FIG. 7F is a flow diagram of the cleaning process (SPM-HF/Nitric) (8$^{th}$ row of FIG. 5F). As shown in FIG. 7F in the process 50F a SPM is applied to a substrate at 140° C. for 10 minutes where the SPM has a ratio of 99% sulfuric acid ($H^2SO^4$) and 1% hydrogen peroxide ($H^2O^2$) (activity 52F).

Then HF/Nitric (Hydrofluoric Acid (HF) and Nitric acid ($HNO^3$)) is applied to the substrate at 30° C. for 5 minutes where the HF/Nitric chemical composition includes 50% Hydrofluoric Acid (HF) and 50% Nitric acid ($HNO^3$) (activity 54F). The Nitric process 50F shown in FIG. 7F and defined in FIGS. 5D and 5E reduces surface iron atom concentration on a sapphire substrate to 4.3 1E10/cm2 ($4.3 \times 10^{10}$ atoms/cm$^2$).

In each of the cleaning processes 44A shown in FIG. 5E, the percentage reduction of surface contamination may also provide an indication of the limited effectiveness of chemical clean processes. Even the most effective clean process only reduces the contaminant surface concentration by about 80%. As noted in FIGS. 5B and 5C very low contaminant concentrations may cause substantial wafer yield losses. Further the clean processes 44A may be limited to particular contaminants. Different chemical clean processes may be needed to remove different contaminant types. Accordingly, several chemical clean processes may need to be employed to remove a variety of different surface contaminants. The chemical processes may not also improve or remove substrate surface damage. As noted above, the contaminants may include transition metals, Alkali metals, non-metals, and metalloids. Chemical processes may not be effective for removing all surface contaminants. As noted dried SiO2, C, Ca, and P are difficult to remove using chemical treatment processes and may require several different chemical processes. It is further noted that the chemical processes may not be effective in reducing substrate 30D surface damage.

In an embodiment of the present invention in order to reduce the contaminant material density and substrate surface damage one or more processes may be applied as shown in FIGS. 8A to 8G. FIG. 8E to 8G are similar to FIGS. 3C to 3E and FIGS. 6C to 6E and represent wafer fabrication after a contaminant density reduction stage (or surface damage reduction) or process (shown in FIGS. 8A to 8D) where the original surface contaminant density (or surface damage level) 32A (show in FIG. 8A) is reduced to 32G as shown in FIG. 8D. As in FIG. 6A, substrate 30D of FIG. 8A is a substantially non-diffuse material to the contaminant material 32A. In addition the substrate 30D may have a large electrostatic energy on its surface making contaminant material reduction and surface damage reduction problematic with standard cleans SC1, SC2 (see FIG. 5D). In an embodiment as explained with reference to FIGS. 5F and 5G and FIGS. 7G to 7I, a layer 26A including material diffuse to the contaminant material to be reduced may be deposited or bonded to the substrate 30F (FIG. 8B). The diffuse material layer 26A may be annealed as shown in FIG. 8C to further diffuse substrate surface contaminants within the annealed diffuse material layer 27A (FIG. 8C).

The anneal temperature may vary as function of the substrate material. In embodiment, the anneal temperature for a sapphire substrate may range from 600 to 1000° C., for a GaN substrate may range from 600 to 1600° C., for a Quartz substrate may range from 600 to 1000° C., and for a SiC substrate may range from 600 to 1700° C. Then using a chemical etch, the diffuse material layer 27A may be removed from architecture 10W to produce a substrate 30G with a surface reduced contaminant material density 32G (and reduced surface damage).

It is noted that the sacrificed layer 26A may remove multiple types of contaminants in one pass including transition metals, Alkali metals, non-metals, and metalloids by capturing the impurity contaminants in the layer 26A while also smoothing or reducing surface damage. Even difficult to remove contaminants including dried SiO2, C, Ca, and P may be removed using the process shown in FIGS. 8A to 8G. The process 50G, 50H, 50I (FIG. 7G, 7H, 7I) may also reduce surface level damage while also reducing contaminant material levels for multiple contaminant material types.

The reduced surface contaminant density substrate 30G may then be bonded with an electrically active layer 20A to form a desired architecture 10Z as shown in FIGS. 8E and 8F (or deposited thereon). In an embodiment the desired architecture 10Z electrically active layer 20A thickness may be reduced by a chemical or mechanical process and annealed in an embodiment to form desired architecture 10AA as shown in FIG. 8G with a reduced electrically active layer 20B. As shown in FIGS. 9A to 9D, in an embodiment layers 26A to 26D having contaminant diffuse material may be deposited or bonded to multiple surfaces of a substrate 10AB. Substrate 30H of architecture 10AB may include an undesired surface contaminant density on one or more surfaces 32A to 32D.

Figure 9B:
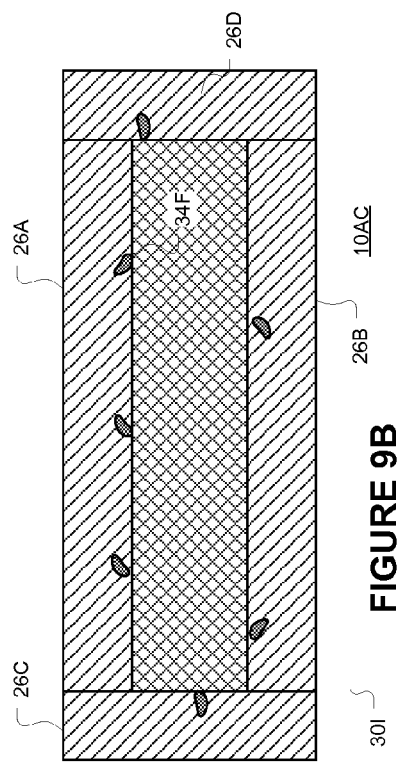
FIG. 9B is a simplified sectional diagram of a semiconductor fabrication architecture at a second fabrication stage including deposited silicon layers on the non-diffuse substrate according to various embodiments.

Deposition or bonding of a layer of contaminant diffuse material to one or more surfaces of substrate 30H as shown in FIG. 9B may cause contaminant material to diffuse within the added layers 26A to 26D to reduce the substrate 30I surface contaminant diffuse density. The added or sacrificial layers 26A to 26D may then be annealed to diffuse more contaminant material within the added or sacrificial layers 27A to 27D as shown in FIG. 9C. Depending on the embodiment the sacrificial layers 26A to 26D of FIG. 9B or the annealed, sacrificial layers 27A to 27D of FIG. 9C may be removed using a chemical process to produce a preprocessed substrate 30J of architecture 10AE (FIG. 9D) having reduced surface contaminant material density 32G. It is noted that the selected contaminant diffuse material of sacrificial layers 26A to 26D (FIG. 9B) or 26A of FIG. 8B must also be chemically weaker than the underlying substrate 30D, 30H material so the sacrificial layers 26A to 26D along with the diffused contaminants can be removed from the substrate 30D, 30H while not damaging the substrate 30D, 30H. It is noted that the substrate 30H surfaces damage may be reduced by the addition of the layers 26A to 26D and their subsequent removal.

Processes for applying a sacrificial layer 26A to 26D are shown in FIGS. 5F and 5G and flow diagrams 7G to 7I. FIG. 5F includes two processes 46A, 46B for preparing a substrate 30D, 30H. In the first process 46A, also shown in FIG. 7G, process 50G, a SPM may be applied to a substrate at 140° C. for 10 minutes where the SPM has a ratio of 99% sulfuric acid ($H^2SO^4$) and 1% hydrogen peroxide ($H^2O^2$) (activity 52G). The SPM application may remove organic contaminants on the substrate and prepare the substrate for deposition of a sacrificial layer(s) 26A to 26D.

Then a contaminant diffuse material may be deposited on one or more surfaces of a contaminated non-diffuse substrate (activity 54G, 54H of FIG. 7G, 7H). In an embodiment about 100 mm or more of polysilicon may be deposited on a non-diffuse substrate at a temperature from about 570 to 620° C. In an embodiment 200 mm or more of polysilicon may be deposited on a non-diffuse substrate at a temperature from about 570 to 620° C. In an embodiment the sacrificial layers 26A to 26D may be deposited using an epitaxial process or a low pressure chemical vapor deposition (LPCVD).

It is noted that in an embodiment, the process 50G and 50H of FIGS. 7G and 7H may be used to reduce surface and embedded contaminant material of a substrate 30A where the substrate may enable diffusion of contaminant material but the sacrificial layers 26A to 26D are more contaminant diffuse than the substrate 30A, 30D, 30H to be prepared.

As shown in FIG. 7H, in process 50H sacrificial layers 26A to 26D may be annealed (activity 56H) prior to chemical etching (activity 58H of FIG. 7H and activity 56G of FIG. 7G) to remove sacrificial layers. As shown in FIG. 5F, column B 46B a sacrificial layer 26A to 26D may be annealed in nitrogen gas $N_2$ at 1000° C. for about 30 minutes. Then in either process 50G, 50H sacrificial layers 26A to 26D (27A to 27D when annealed) may be removed by applying a chemical etch to remove the layers and diffused contaminant material. In an embodiment a chemical etch solution including 50% Hydrofluoric Acid (HF) and 50% Nitric acid ($HNO^3$) is applied for 2 minutes at a temperature 25° C. (activity 54G, FIG. 7G, 58H, FIG. 7H). Application of process 46A, 46B via method 50G, 50H may reduce surface contaminant material including transition metals, Alkali metals, non-metals, and metalloids and reduce substrate surface damage. In an embodiment, application of process 46A, 46B via method 50G, 50H may reduce surface iron atom concentration on a sapphire substrate to increase the effective yield of wafers formed from the processed substrates 30D, 30H. In another embodiment sacrificial layers 26A to 26D (27A to 27D when annealed) may be etched using oxidation such as hydrofluoric acid (HF), buffered oxide etch (BOE), or Tetramethylammonium Hydroxide 25% (TMAH).

FIG. 5G includes a process 46C for preparing a substrate 30D, 30H. In the process 46C, also shown in FIG. 7I, process 50I, a SPM may be applied to a substrate at 140° C. for 10 minutes where the SPM has a ratio of 99% sulfuric acid ($H^2SO^4$) and 1% hydrogen peroxide ($H^2O^2$) (activity 52I). The SPM application may remove organic contaminants on the substrate and prepare the substrate for deposition of a sacrificial layer(s) 26A to 26D.

Then a contaminant diffuse material may be bonded with one or more surfaces of a contaminated non-diffuse substrate (activity 54I of FIG. 7I). In an embodiment about 100 mm or more of polysilicon may be bonded with a non-diffuse substrate. In an embodiment 100 mm or more of polysilicon may be bonded with a non-diffuse substrate.

In an embodiment, a polysilicon layer 26A to 26D may be formed separately and then bonded to the substrate 30D, 30H to cause surface contaminant material to diffuse into the polysilicon layer 26A to 26D. It is noted that in an embodiment, the process 50I of FIG. 7I may be used to reduce surface and embedded contaminant material of a substrate 30A where the substrate may enable diffusion of contaminant material but the sacrificial layers 26A to 26D are more contaminant diffuse than the substrate 30A, 30D, 30H to be prepared.

As shown in FIG. 7I, in process 50I sacrificial layers 26A to 26D may be annealed (activity 56I) prior to chemical etching (activity 58I of FIG. 7I) of the sacrificial layers 26A to 26D to remove the layers. As shown in FIG. 5G, process 46C a sacrificial layer 26A to 26D may be annealed in nitrogen gas $N_2$ at 600° C. for about 30 minutes. Then in process 50I, sacrificial layers 27A to 27D may be removed by applying a chemical etch (or mechanical process in an embodiment) to remove the layers and diffused contaminant material. As noted the process may also reduce substrate surface layer damage. In an embodiment a chemical etch solution including 50% Hydrofluoric Acid (HF) and 50% Nitric acid ($HNO^3$) is applied for 2 minutes at a temperature 25° C. (activity 54I, FIG. 7I). Application of process 46C via method 50I may reduce surface contaminant material including transition metals, Alkali metals, non-metals, and metalloids and reduce substrate surface damage. In an embodiment, application of process 46C via method 50I may reduce surface iron atom concentration on a sapphire substrate to increase the effective yield of wafers formed from the processed substrates 30D, 30H.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method for reducing a concentration of particular surface contaminants from a surface of an insulating substrate of a semiconductor architecture prior to bonding with another layer, the insulating substrate being substantially non-diffusive to the particular surface contaminants, the method including:

depositing a semiconductor layer on the surface of the insulating substrate surface having a first concentration of the particular surface contaminants;

based on the depositing, diffusing a portion of the particular surface contaminants into the semiconductor layer;

based on the diffusing, removing the portion of the particular substrate contaminants from the surface of the insulating substrate, and removing the deposited semiconductor layer from the surface of the insulating substrate, thereby obtaining a second concentration of the particular surface contaminants on the surface of the insulating substrate, the second concentration being substantially lower than the first concentration.

2. The method of claim 1, wherein the deposited semiconductor layer has a second diffusion level, the insulating substrate has a first diffusion level, and the second diffusion level is greater than the first diffusion level.

3. The method of claim 1, further comprising annealing the deposited semiconductor layer prior to removal.

4. The method of claim 3, wherein the portion of the particular surface contaminants comprise a first portion and a second portion, the first portion of the particular surface contaminants diffusing into the deposited semiconductor layer during its deposition on the insulating substrate surface and the second portion of the particular surface contaminants further diffusing into the deposited semiconductor layer during annealing.

5. The method of claim 1, wherein the particular surface contaminants include one or more of a transition metal, an alkali metal, a non-metal, and a metalloid.

6. The method of claim 1, wherein the particular surface contaminants include a transition metal.

7. The method of claim 1, wherein the insulating substrate has a level of surface damage and the surface damage level is reduced after removal of the deposited semiconductor layer.

8. The method of claim 1, wherein the deposited semiconductor layer consists primarily of polysilicon.

9. The method of claim 1, wherein the insulating substrate consists primarily of Sapphire.

10. A method for removing particular surface contaminants from a surface of a substantially non-diffusive insulating substrate to the particular surface contaminants, the insulating substrate having a first diffusion level, the method including:

depositing a layer of material on the surface of the insulating substrate, the material having a second diffusion level, the second diffusion level greater than the first diffusion level;

based on the depositing. diffusing a portion of the particular surface contaminants into the deposited layer of material:

based on the diffusing. removing the portion of the particular surface contaminants from the surface of the insulating substrate; and removing the layer of deposited material from the surface of the insulating layer.

11. The method of claim 10, further comprising annealing the deposited material layer prior to removal.

12. The method of claim 11, wherein the portion of the particular surface contaminants comprise a first portion and a second portion, the first portion of the particular surface contaminants diffusing into the deposited material layer during its deposition on the insulating substrate surface and the second portion of the particular surface contaminants further diffusing into the deposited material layer during the annealing.

13. The method of claim 12, wherein the particular surface contaminants include one or more of a transition metal, an alkali metal, a non-metal, and a metalloid.

14. The method of claim 12, wherein the particular surface contaminants include a transition metal.

15. The method of claim 10, wherein the insulating substrate has a level of surface damage and the surface damage level is reduced after removal of the deposited material layer.

16. The method of claim 10, wherein the deposited material layer consists primarily of a semiconductor.

17. The method of claim 10, wherein the deposited material layer consists primarily of polysilicon.

18. The method of claim 10, wherein the insulating substrate consists primarily of Sapphire.

19. A method of forming a semiconductor architecture including an insulating substrate bonded to an electrically active semiconductor layer, the method including:
removing a portion of particular surface contaminants from the surface of the insulating substrate, the insulating substrate being substantially non-diffusive to the particular surface contaminants, the removing comprising the steps of:
depositing a layer of material on the insulating substrate surface, wherein the material has a second diffusion level, the insulating substrate has a first diffusion level; and the second diffusion level is greater than the first diffusion level;
(ii) based on the depositing, diffusing a portion of the particular surface contaminants into the deposited layer of material;
(iii) based on the diffusing, removing the portion of the particular surface contaminants from the surface of the insulatging substrate; and
(iv) removing the layer of deposited material from the insulating substrate surface.

20. The method of forming a semiconductor architecture including an insulating substrate of claim 19, the removing of the particular surface contaminants step further comprising annealing the deposited material layer prior to removal.

21. The method of forming a semiconductor architecture including an insulating substrate of claim 20, wherein the portion of the particular surface contaminants comprise a first portion and a second portion, the first portion of the particular surface contaminants diffuse into the deposited material layer during its deposition on the insulating substrate surface and second portion of the particular surface contaminants further diffuse into the deposited material layer during the annealing.

22. The method of forming a semiconductor architecture including an insulating substrate of claim 21, wherein the particular surface contaminants include one or more of a transition metal, an alkali metal, a non-metal, and a metalloid.

23. The method of forming a semiconductor architecture including an insulating substrate of claim 21, wherein the particular surface contaminants include a transition metal.

24. The method of forming a semiconductor architecture including an insulating substrate of claim 19, wherein the insulating substrate has a level of surface damage and the surface damage level is reduced after removal of the deposited material layer.

25. The method of forming a semiconductor architecture including an insulating substrate of claim 19, wherein the deposited material layer consists primarily of a semiconductor.

26. The method of forming a semiconductor architecture including an insulating substrate of claim 19, wherein the deposited material layer consists primarily of polysilicon.

27. The method of forming a semiconductor architecture including an insulating substrate of claim 19, wherein the insulating substrate consists primarily of Sapphire.

28. The method of claim 1, wherein the insulating substrate consists of a material with a binding energy greater than 50 eV.

29. The method of claim 10, wherein the insulating substrate consists of a material with a binding energy greater than 50 eV.

30. The method of claim 19, wherein the insulating substrate consists of a material with a binding energy greater than 50 eV.

* * * * *